US011811247B2

(12) United States Patent
Zhou et al.

(10) Patent No.: US 11,811,247 B2
(45) Date of Patent: Nov. 7, 2023

(54) METHOD AND SYSTEM FOR DUAL EQUILIBRIUM BATTERY AND BATTERY PACK PERFORMANCE MANAGEMENT

(71) Applicant: Troes Corporation, Markham (CA)

(72) Inventors: Wei Zhou, Markham (CA); Yiwen Xia, Markham (CA)

(73) Assignee: Troes Corporation, Markham (CA)

( * ) Notice: Subject to any disclaimer, the term of this patent is extended or adjusted under 35 U.S.C. 154(b) by 0 days.

(21) Appl. No.: 16/874,061

(22) Filed: May 14, 2020

(65) Prior Publication Data

US 2020/0366103 A1 Nov. 19, 2020

Related U.S. Application Data

(60) Provisional application No. 62/848,833, filed on May 16, 2019.

(51) Int. Cl.
    *H02J 7/00* (2006.01)
    *H02J 1/10* (2006.01)
    *H01M 10/0525* (2010.01)
    *G01R 31/382* (2019.01)

(52) U.S. Cl.
    CPC .......... *H02J 7/0014* (2013.01); *G01R 31/382* (2019.01); *H01M 10/0525* (2013.01); *H02J 1/106* (2020.01); *H02J 7/0048* (2020.01)

(58) Field of Classification Search
    CPC .. G01R 31/367; G01R 31/382; G01R 31/396; H02J 1/106; H02J 7/0014; H02J 7/0048; H01M 10/0525; H01M 10/425; H01M 2010/4271; Y02E 60/10

USPC ........................................................ 320/132
See application file for complete search history.

(56) References Cited

U.S. PATENT DOCUMENTS

| 8,732,098 B2 * | 5/2014 | Ahmad | G06N 3/049 706/45 |
| 8,855,954 B1 * | 10/2014 | Bickford | G07C 3/08 702/63 |
| 9,002,775 B1 * | 4/2015 | Harrison | G06N 20/00 706/52 |
| 9,478,994 B2 * | 10/2016 | Sidorenko | H02J 7/0018 |
| 9,484,753 B2 * | 11/2016 | Bui-Van | B60L 58/22 |

(Continued)

FOREIGN PATENT DOCUMENTS

| CN | 106208236 A | * | 12/2016 |
| CN | 107895212 A | * | 4/2018 |

(Continued)

OTHER PUBLICATIONS

International Search Report for International Application PCT/CA2020/050651 dated Jul. 10, 2020.

(Continued)

*Primary Examiner* — Suresh Memula
(74) *Attorney, Agent, or Firm* — Gowling WLG (Canada) LLP

(57) ABSTRACT

A method and system for battery performance management that provides dual-equilibrium battery management based on the conditions of battery cells within the battery. Battery management is performed using a passive battery equilibrium approach until a condition within the battery is sensed whereby battery management is then performed using an active battery equilibrium approach.

14 Claims, 19 Drawing Sheets

(56) References Cited

U.S. PATENT DOCUMENTS

| | | | | |
|---|---|---|---|---|
| 9,847,655 | B2* | 12/2017 | Bailly | H02J 7/0016 |
| 11,218,005 | B2* | 1/2022 | Winters | H01M 10/425 |
| 2012/0022816 | A1* | 1/2012 | Zenati | G01R 31/3842 |
| | | | | 702/63 |
| 2013/0314094 | A1 | 11/2013 | Farmer et al. | |
| 2015/0077039 | A1 | 3/2015 | Soong | |
| 2016/0018472 | A1 | 1/2016 | Sung et al. | |
| 2017/0123009 | A1* | 5/2017 | You | G01R 31/392 |
| 2018/0143257 | A1* | 5/2018 | Garcia | G01R 31/382 |
| 2018/0166911 | A1* | 6/2018 | Ionescu | B60L 58/22 |
| 2019/0089020 | A1* | 3/2019 | Ikeno | H01M 10/441 |
| 2019/0109468 | A1* | 4/2019 | Lòpez | H02J 7/0014 |
| 2019/0148701 | A1* | 5/2019 | Ashrafzadeh | H02J 7/0014 |
| | | | | 429/158 |
| 2019/0215796 | A1* | 7/2019 | Poosamani | H04W 52/245 |
| 2019/0221897 | A1* | 7/2019 | Basu | H01M 10/482 |
| 2019/0222034 | A1* | 7/2019 | Stuart | H01M 10/425 |
| 2019/0288520 | A1* | 9/2019 | Abdel-Monem | H02J 7/0029 |
| 2020/0044461 | A1* | 2/2020 | Winters | H02J 7/0031 |
| 2020/0052502 | A1* | 2/2020 | Statman | H01M 10/441 |
| 2020/0052503 | A1* | 2/2020 | Statman | H01M 10/482 |
| 2020/0185931 | A1* | 6/2020 | Stuart | H02J 7/345 |
| 2020/0220363 | A1* | 7/2020 | Marquet | H02J 7/0069 |
| 2020/0303938 | A1* | 9/2020 | Owen | H01M 10/44 |
| 2020/0339010 | A1* | 10/2020 | Villanueva | H01M 10/6552 |
| 2020/0346558 | A1* | 11/2020 | Luo | H02J 7/0019 |
| 2021/0135293 | A1* | 5/2021 | Hong | G06N 3/08 |
| 2021/0255246 | A1* | 8/2021 | Han | G06N 20/00 |
| 2021/0256542 | A1* | 8/2021 | McDaniel | G06V 40/174 |
| 2021/0305816 | A1* | 9/2021 | Kuranuki | H01M 10/482 |
| 2021/0311129 | A1* | 10/2021 | Yezerets | G01R 31/392 |

FOREIGN PATENT DOCUMENTS

| | | | | |
|---|---|---|---|---|
| CN | 107968452 | A | 4/2018 | |
| CN | 108964172 | A | 12/2018 | |
| CN | 105226733 | B | 4/2019 | |
| JP | 6873951 | B2 * | 5/2021 | B60L 58/21 |
| WO | WO-2019017991 | A1 * | 1/2019 | B60L 3/12 |
| WO | WO-2019017994 | A1 * | 1/2019 | B60L 3/0046 |
| WO | 2019042398 | A1 | 3/2019 | |

OTHER PUBLICATIONS

Extended European Search Report for corresponding European Patent Application No. 20806553.2 dated Jan. 3, 2023.

* cited by examiner

| Item | Spec |
|---|---|
| Cell capacity | 136 Ah |
| Voltage range | 2.5~3.65 V |
| Internal resistance | 0.42 mΩ |
| Scope of State of Charge (SOC) | 20%~95% |
| Working temperature (charging) | 0~45°C |
| Working temperature (discharge) | -20~60°C |
| Cycle life | ≥4000 |
| Weight of cell | ≤2.95 |
| Dimension (W/L/H) | 174/50/171mm |

Figure 6a

| Item | Spec |
|---|---|
| Nominal Voltage | 51.2 V |
| Capacity | 136 Ah |
| Energy | 6.96 kWh |
| Configuration | 1P 16S |
| Weight | 62 kg |
| Dimension (W/D/H) | 482/580/191mm |

Figure 6b

METHOD AND SYSTEM FOR DUAL EQUILIBRIUM BATTERY AND BATTERY PACK PERFORMANCE MANAGEMENT

CROSS-REFERENCE TO RELATED APPLICATIONS

The current application claims priority from U.S. Provisional Application No. 62/848,833 filed May 16, 2019 which is hereby incorporated by reference.

FIELD

The disclosure is generally related to batteries and, more specifically, to a method and system for battery and battery pack performance management.

BACKGROUND

Batteries have been around for many years powering different appliances and other devices. Typically, a battery pack includes a certain number of battery cells. The individual cells in a battery pack have different capacities and might be at different State of Charges (SOC). Because of small differences in manufacturing or operating conditions, each cell in a battery pack charges and discharges at a slightly different rate. In a battery pack where battery cells are connected in series, the cell with the smallest capacity is a problem. It can easily be overcharged or over-discharged while cells with higher capacities are, simultaneously, partially charged or partially discharged. Therefore, the capacity of a battery pack is limited by the battery cell with lowest capacity. Furthermore, in a battery pack, the small capacity differences between the cells tend to be magnified with each charge and discharge cycle, which could cause permanent failure of the battery cell and also the battery pack as a whole. Imbalance of cells in a battery pack is a factor in determining the lifetime of a battery pack. Lithium-ion (Li-ion) batteries are used in many of these battery packs.

As such, Li-ion batteries are used in many different applications to power devices. However, Li-ion battery cells have two design issues: (i) if they are overcharged, they can be damaged which may cause overheating and even an explosion, and (ii) Li-ion cells can be damaged if they are discharged below a certain threshold, approximately 5 percent of total capacity. If the cells are discharged below this threshold, their capacity can become permanently reduced. In addition, unlike lead-acid or NiCd/NiMh cells, Li-ion cells are much more sensitive to overvoltage caused by an overcharge.

Therefore, there is provided a method and system for battery and battery pack performance management that overcomes some disadvantages of current systems.

SUMMARY OF THE DISCLOSURE

In one embodiment, the disclosure is directed at a method of dual equilibrium battery management. The dual equilibrium battery management may be used for a battery pack module or a whole battery rack formed by battery packs connected in series. More particularly, the present disclosure is directed to a dual-equilibrium battery management system and dual-equilibrium battery management method. In one embodiment of the system, the system combines an active equilibrium or active balancing battery management system with a passive equilibrium or passive balancing battery management system for battery cell management. In an embodiment of the method, the method determines a switching condition between the passive and active equilibrium battery management systems and/or determines equilibrium strategies. This disclosure can be applied to the Battery Management Systems (BMS) in Battery Energy Storage System (BESS) and Uninterruptible Power Sources (UPS).

In accordance with an aspect of the present disclosure, there is provided a dual-equilibrium battery system and dual-equilibrium battery management method for equalization of a battery pack made up of a plurality of battery cells. The system generally runs or executes a passive equilibrium battery management approach and run or executes an active equilibrium battery management approach when a determination is made that active equilibrium battery management is required. For instance, when a state of charge (SOC) difference reaches predetermined values between a highest SOC capacity battery cell and a lowest SOC capacity battery cell.

In one embodiment, the method includes utilizing a K-Nearest Neighbor (KNN) method to determine if the system should be operating using active equilibrium battery cell management. If it is determined that active equilibrium battery cell management is required, the system sends an active equilibrium maintenance request to a cloud-based monitoring system or the local monitoring system (HMI, etc). The system then monitors the battery to determine if active equilibrium battery management is still required and, if not, returns to passive equilibrium battery management.

In accordance with an aspect of the present disclosure, there is provided an apparatus for equalization of a battery pack that is composed of a plurality of battery cells. In one embodiment, the apparatus includes: a battery pack including 16 battery cells, a BMS with passive cell balancing system, a refresh kit which provides active equilibrium maintenance, and a cloud-based monitor system. It will be understood that the battery pack may include any number of battery cells and that the disclosure may be beneficial for any type of battery chemistry as well.

In one aspect of the disclosure, there is provided a method of dual equilibrium battery cell management for a battery having a set of battery cells including determining if an active equilibrium battery management approach should be used; changing battery cell management from a passive equilibrium battery management approach to the active equilibrium battery management approach.

In another aspect, before determining if the active battery management approach should be used, using the passive equilibrium battery management approach for battery cell management. In a further aspect, determining if the active equilibrium battery management approach should be used includes determining a state of charge (SOC) capacity of each of the battery cells in the set of batter cells; determining a highest capacity SOC from the state of charge (SOC) capacity of each of the battery cells in the set of battery cells; determining a lowest capacity SOC from the state of charge (SOC) capacity of each of the battery cells in the set of battery cells; and comparing the highest capacity SOC and the lowest capacity SOC via a non-parametric process. In yet another aspect, the non-parametric process includes a K-Nearest Neighbour (KNN) algorithm.

In an aspect, the method further includes transmitting a signal requesting the active equilibrium battery management approach. In another aspect, the method further includes connecting an active equilibrium apparatus when the signal requesting the active equilibrium battery management approach is received. In yet a further aspect, the method includes connecting an active equilibrium apparatus when it is determined that the active equilibrium battery management approach is to be used. In another aspect, determining if the active equilibrium battery management approach should be used is based on a non-parametric approach. In a further aspect, the non-parametric approach is based on a k Nearest Neighbor (kNN) algorithm.

In another aspect of the disclosure, there is provided an apparatus for dual equilibrium battery cell management for a battery having a set of battery cells including a passive equilibrium battery management apparatus continuously connected to the battery; an active equilibrium battery management apparatus; and a processor for determining when the active equilibrium battery management apparatus is to be connected to the battery.

In a further aspect, the passive equilibrium battery management apparatus is connected to the battery via a set of communication ports. In another aspect, the active equilibrium battery management apparatus is connected to the battery via a set of communication ports. In yet another aspect, the processor is connected to the battery to receive battery signals from the battery. In yet a further aspect, the active equilibrium battery management apparatus is an active equilibrium refresh kit.

BRIEF DESCRIPTION OF THE DRAWINGS

Embodiments of the present disclosure will now be described, by way of example only, with reference to the attached Figures.

FIG. 6a is a chart outlining some of the battery cell parameters;

FIG. 6b is a chart outlining some of the battery pack parameters;

DETAILED DESCRIPTION OF THE PREFERRED EMBODIMENTS

Figure 1:
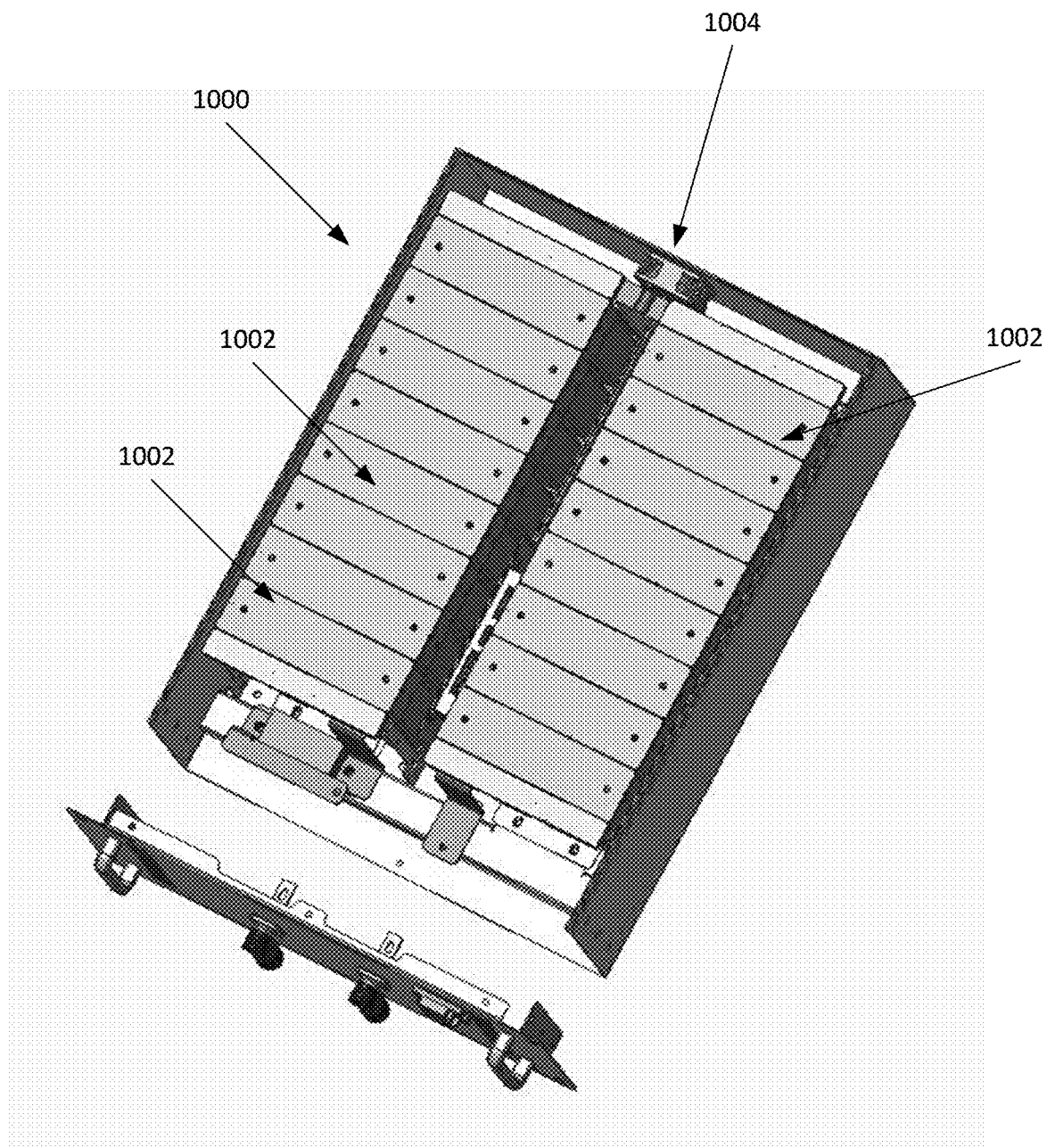
FIG. 1 is a perspective view of a battery pack with a set of individual battery cells.

In the following, various example systems and methods will be described herein to provide example embodiment(s). It will be understood that no embodiment described below is intended to limit any claimed invention. The claims are not limited to systems, apparatuses or methods having all of the features of any one embodiment or to features common to multiple or all of the embodiments described herein. A claim may include features taken from any embodiment as would be understood by one of skill in the art. The applicants, inventors or owners reserve all rights that they may have in any invention disclosed herein, for example the right to claim such an invention in a continuing or divisional application and do not intend to abandon, disclaim or dedicate to the public any such invention by its disclosure in this document.

The disclosure is directed at a method and system for dual equilibrium battery performance management. In one embodiment, the system includes a cell balancing system that monitors and controls the capacities of battery cells within a battery pack and the battery system. One advantage of the current disclosure is to increase the lifespan of a battery back.

This disclosure is also directed at a dual-equilibrium battery system and dual-equilibrium battery management method that combines passive and active equilibrium balancing systems. The system includes a monitoring system to determine the switching condition between the two balancing systems. The advantage of combining passive and active balancing systems and/or methods is that the BMS system can maintain a stable and low-cost state in normal mode when the difference between the maximum or highest cell capacity and minimum or lowest capacity is within the threshold value. In addition, the BMS can balance the cell capacity in a fast and efficient way by charging lean cells from the richer cells when the capacity difference exceeds the threshold value.

In one embodiment, the system of the disclosure controls the charging and discharging level for different capacity cells in a battery pack. In a properly balanced battery pack, the cell with the largest capacity will be filled without overcharging any other weaker and/or smaller battery cell. There are two general methods or approaches for battery cell balancing: (i) active and (ii) passive.

Passive equilibrium or balancing battery management between the cells in a battery pack is based on removing energy from higher state-of-charge (SOC) cells through a discharge resistive circuit until their energy level(s) match that of the lowest SOC cell. While the passive battery equilibrium approach provides a fairly low-cost method for balancing the cells, it typically does not optimize the runtime of a battery pack. Passive balancing has a rather high balancing time due to the need for heat dissipation. In addition, energy is wasted in the process due to the discharge resistance and the reduction in overall charging efficiency.

The second method, active battery balancing, or an active equilibrium battery management approach, is performed by transferring energy between individual battery cells until the SOC of the cell with the lowest capacity is equal to the battery pack SOC. The energy is transferred from the strongest cell to the whole battery or other cells, and from the battery or other cells to the weakest cell. Active balancing can avoid most of the equalizing losses, resulting in higher overall system capacity than may be achieved with the passive balancing approach. The disadvantage of active balancing is the relatively high cost of the circuit when compared to passive balancing. In addition, since the switching frequency of the balancing circuit is quite high, it is less stable than the circuit used in the passive balancing. Active balancing can also damage batteries if used too frequently. Therefore a battery management method and system that includes an active and a passive balancing system is disclosed.

Figure 2:
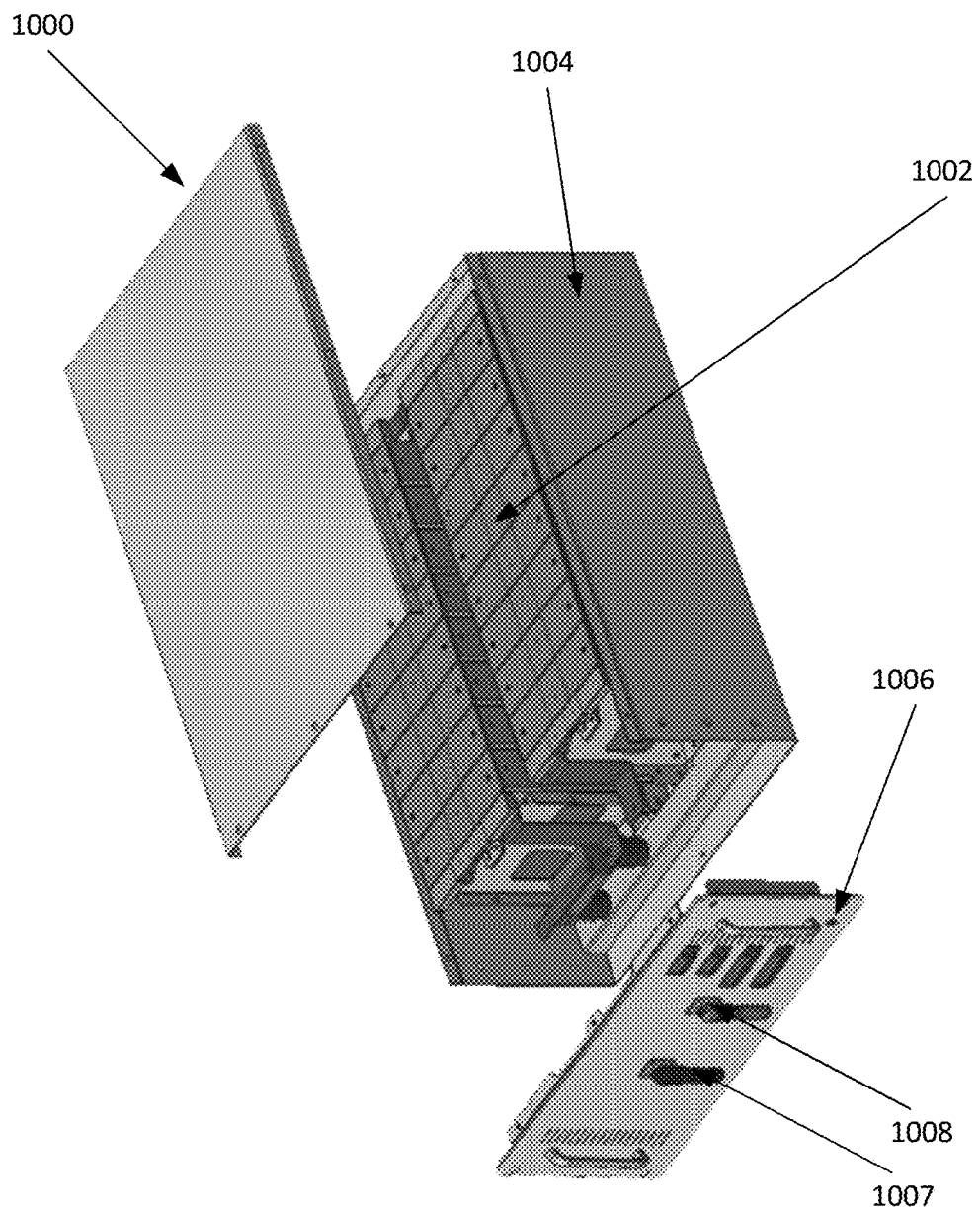
FIG. 2 is another perspective view of the battery pack of FIG. 1 with a housing.
Figures 3A, 3B, 3C:
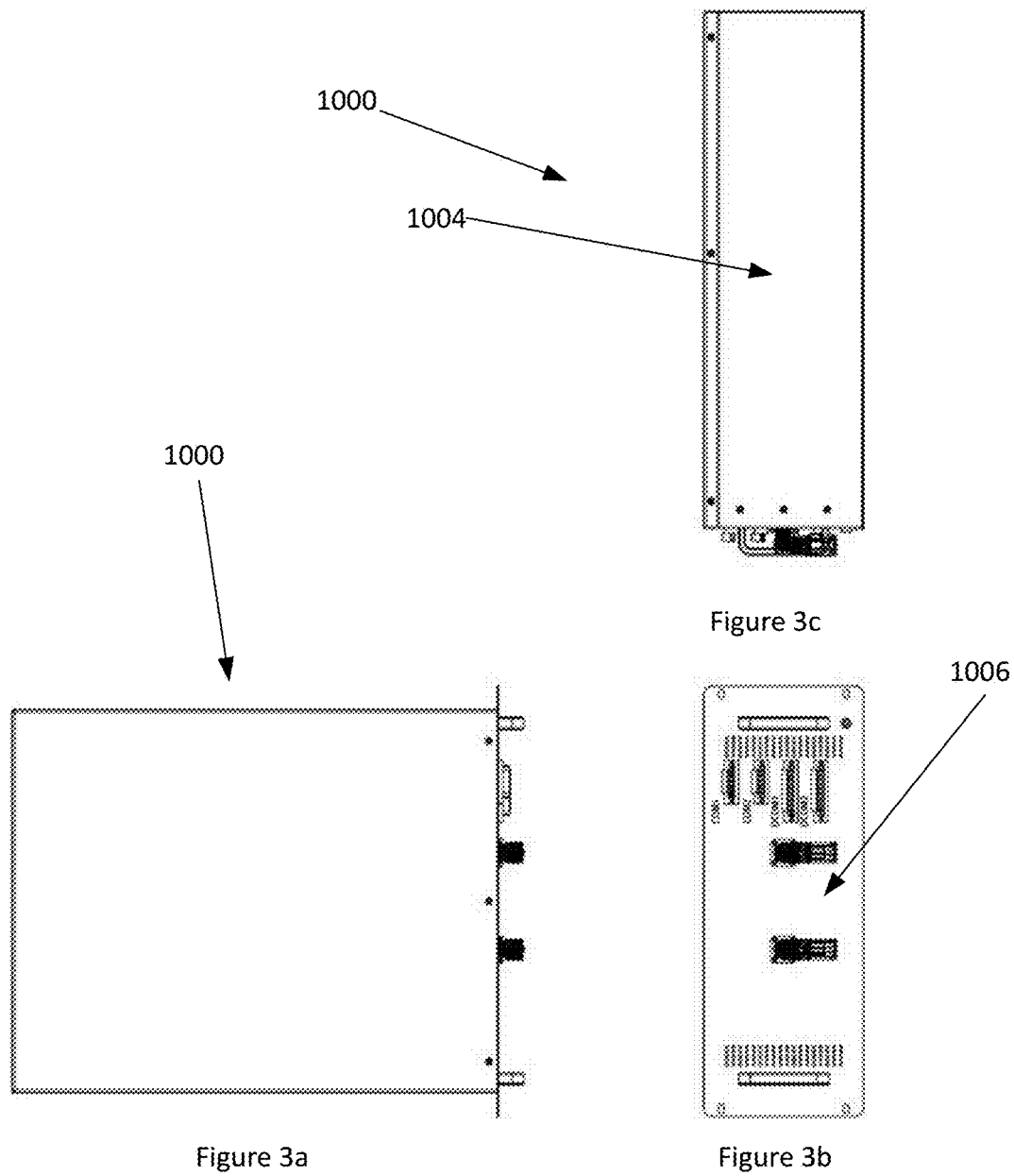
FIGS. 3a to 3c are top, front and side views, respectively of the battery pack of FIG. 1.
Figure 3D:
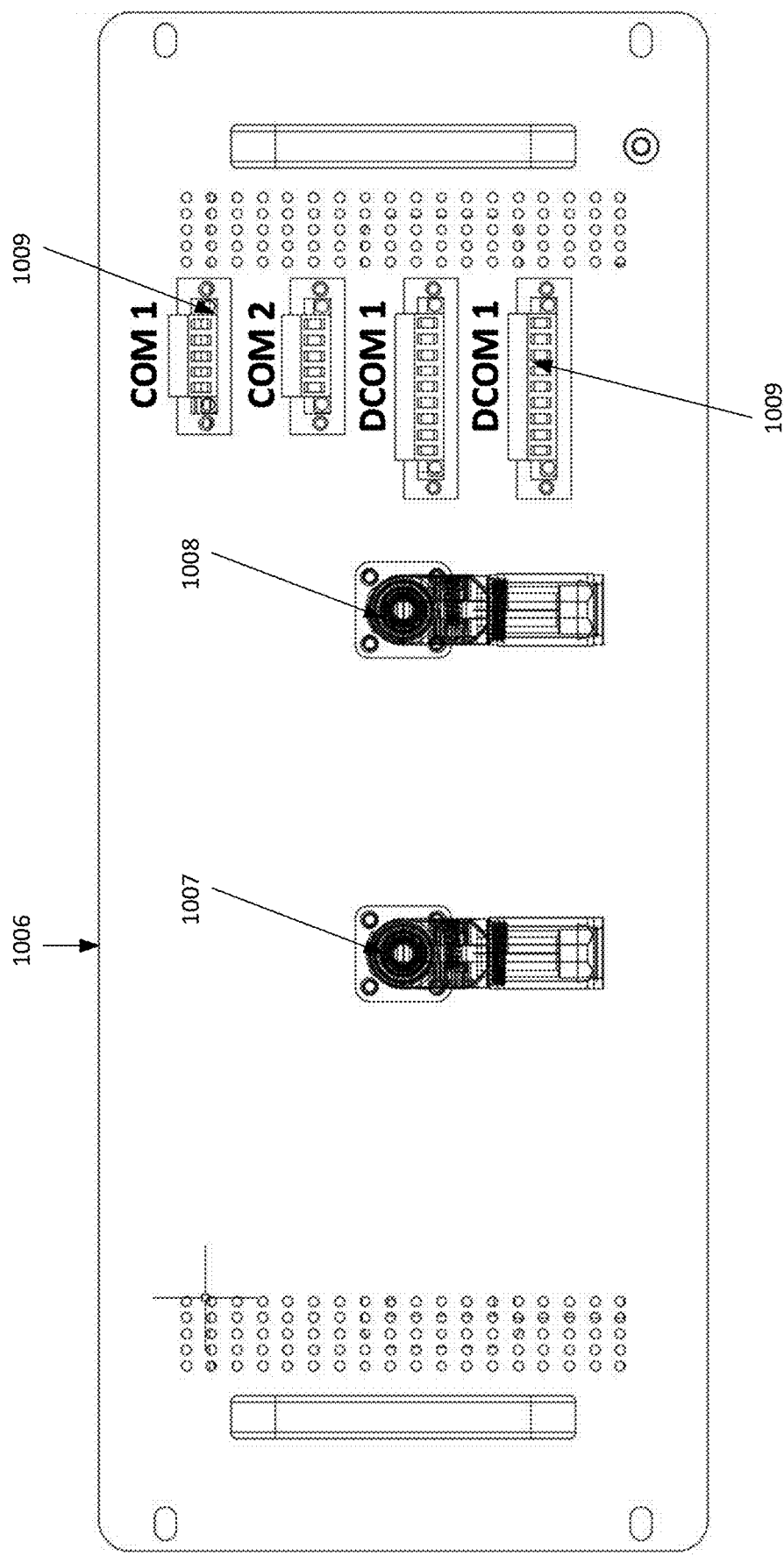
FIG. 3d is an enlarged front view of the battery pack.

Referring to FIGS. 1 and 2, in one embodiment, a battery pack contains a set of, for instance, sixteen (16) battery cells. It will be understood that the battery pack 1000 may include any number and any brand of battery cells 1002 and that the 16 cells of FIGS. 1 and 2 is simply one example of a battery pack that may benefit from the dual-equilibrium battery performance management method and system of the disclosure. As shown, the battery cells 1002 are located within a battery housing 1004. The battery 1000 further includes a front face 1006 that includes a positive pole 1007, a negative pole 1008, and communication ports 1009 (as shown in FIG. 3d). The positive pole 1007 is the DC output positive side of the battery pack while the negative pole is the DC output negative side of the battery pack.

The communication ports 1009 enable information exchange between the battery management system and an active equilibrium refresh kit or active battery equilibrium approach apparatus.

Figure 10:
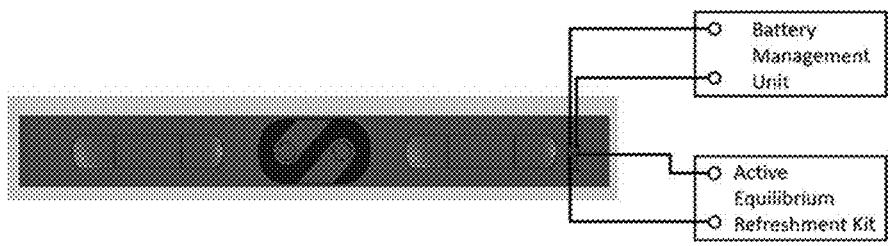
FIG. 10 is a schematic diagram of the battery pack of FIG. 9 with a dual-equilibrium battery system.

In real-time operation, the dual-equilibrium system and method of the disclosure is applied to all the battery cells in a string of batteries or battery packs within a system. For example, if a string of batteries includes 10 battery packs and 16 battery cells for each pack, the dual-equilibrium system and method would be applied to all the 160 battery cells in this battery string. FIG. 10 shows a layout of an alternative battery pack which could benefit from the dual-equilibrium method of the disclosure.

Referring to FIG. 3d, the front face 1006, or interface, of the battery pack includes different communication ports 1009 labelled COM1, COM2, DCOM1, and DCOM2. In one embodiment, communication ports COM 1 and COM 2 are used for connecting the battery to a passive equilibrium battery management system, which may be located within a battery management system. In one embodiment, communication ports DCOM 1 and DCOM 2 are used for connecting the battery to an active equilibrium battery management system, such as, but not limited to, an active equilibrium refresh kit when active equilibrium is required.

FIG. 6a is a chart outlining one example of a battery cell specification used in an embodiment. The battery cell chemistry is Lithium-iron Phosphate. The battery capacity is 136 Ah, and battery cell voltage is 2.5-3.65 VDC, rated voltage is 3.2 VDC, which is the standard voltage value for most of the LFP battery cells in market.

FIG. 6b is a chart outlining an example of a battery pack specification used in one embodiment. The battery pack includes 16 battery cells mentioned in FIG. 6a connected in series. The voltage of battery the pack is 51.2 VDC with a capacity of 6.96 kWh.

Figure 7:
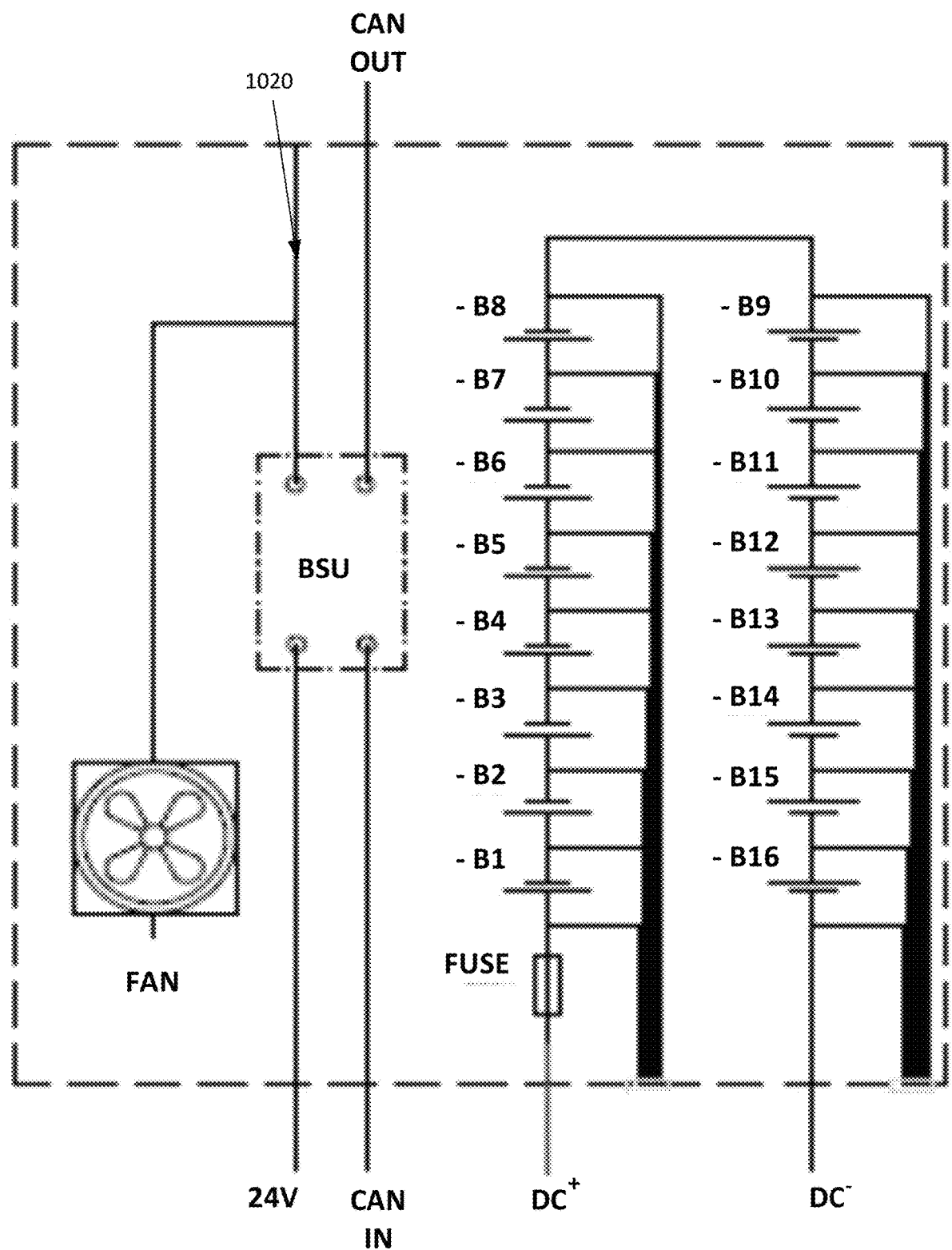
FIG. 7 is the single line diagram of the battery pack system.

Referring to FIG. 7, which is a schematic circuit diagram of the connections between battery cells in the battery pack of FIG. 1, for the battery cells in one battery pack, the battery cells are preferably connected in series. In the current embodiment, the battery pack includes a Battery Signal Unit (BSU) 1020 for enabling communication between the battery cells and a Battery Management Unit (BMU) through a CAN OUT line. The communication may include signals or information required for battery series management such as, but not limited to, voltage detection, temperature detection, voltage balancing, and protection.

Figure 11:
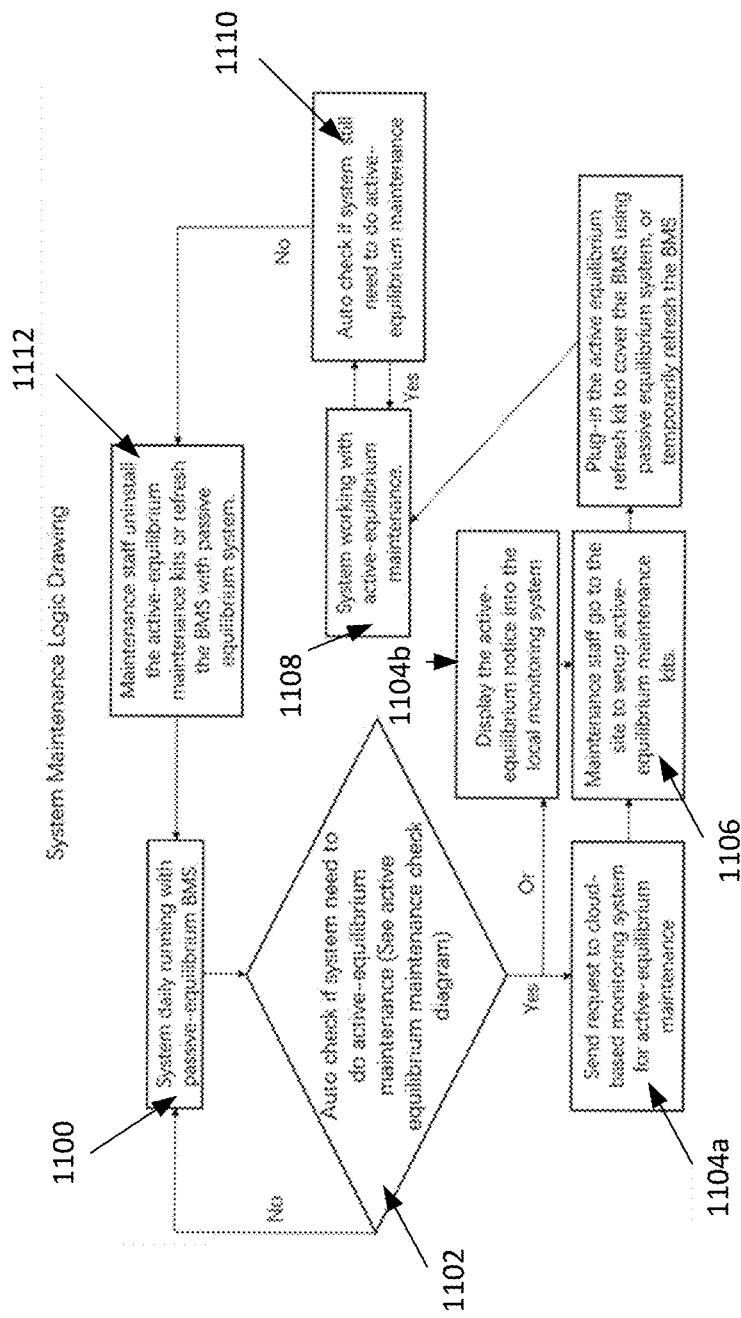
FIG. 11 is a flowchart showing a method of dual-equilibrium battery management.

In operation, the BMU executes a passive equilibrium or passive balancing battery management system. A Battery Management System (BMS) refresh kit which can provide active equilibrium or battery management balancing is connected to the battery pack such as via communication ports DCOM1 and DCOM2 when the active equilibrium or balancing maintenance is required. Alternatively, an active equilibrium battery management apparatus may be continuously connected to the battery. In order to determine how battery management should be performed or which balancing method is required, either via passive or active equilibrium, an apparatus for judging or making this determination (such as via KNN or ANN as outlined below) is connected to communication ports COM1 and COM2 to perform regular checks. In one embodiment, this may be performed daily. The regular checks process is shown in FIG. 11. When the BMS judges that the active equilibrium is required such as according to the method shown in FIG. 11, or a preset cycling number is reached, the BMS transmits a maintenance notice to users through on-site HMI (Human Machine Interface) or cloud based monitoring system or may automatically enable active equilibrium balancing.

Figure 4:
FIG. 4 is a screenshot of a cloud base monitoring system interface.
Figure 5:
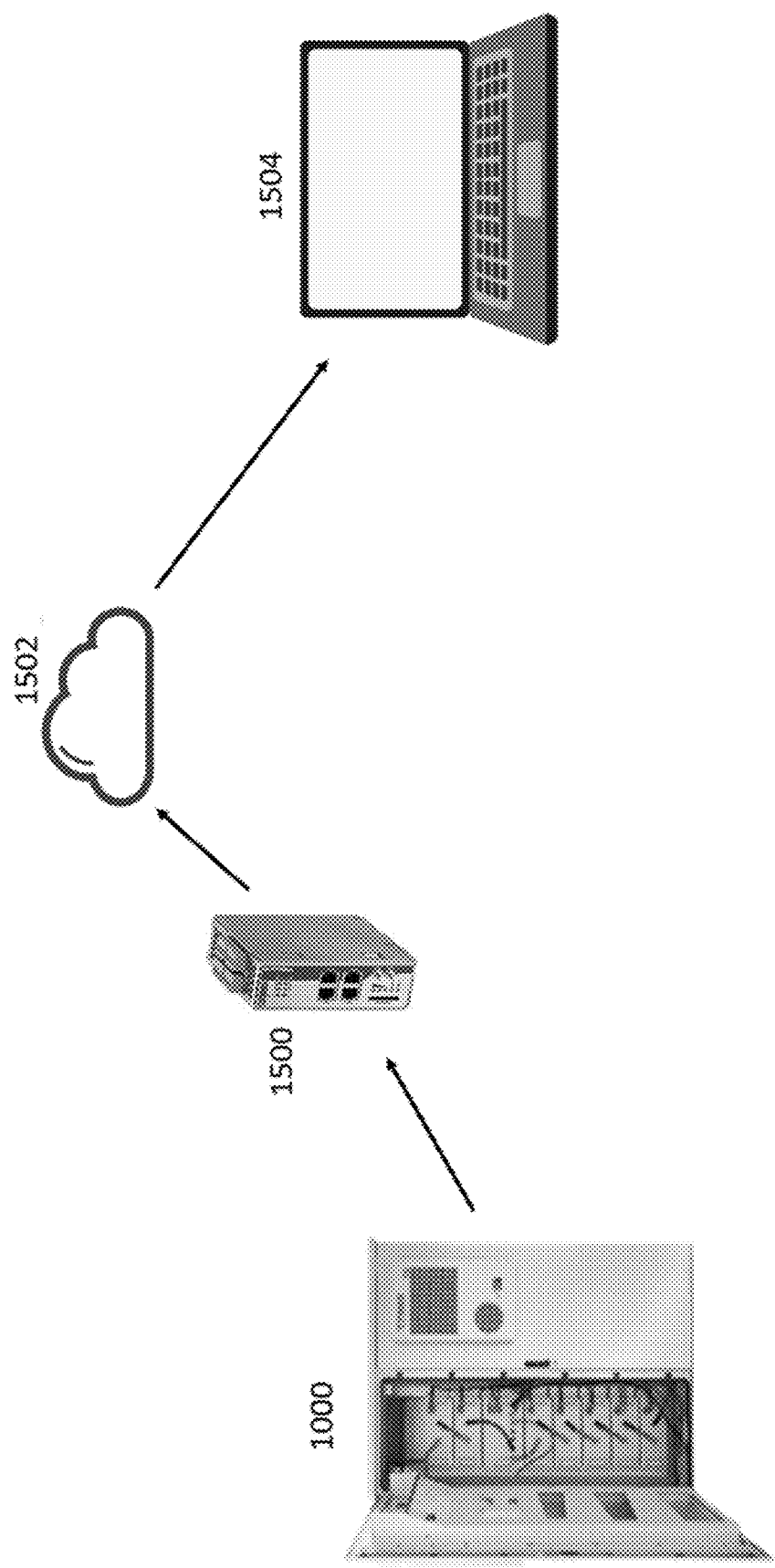
FIG. 5 is a schematic diagram of a cloud based monitoring system in accordance with an embodiment of the disclosure.

Turning to FIG. 5, a schematic diagram of the monitoring system is shown. In one embodiment, information, such as battery data and a request for active equilibrium balancing, is transmitted from the battery 1000 to a cellular router 1500. The cellular router 1500 then uploads this information to the Cloud 1502 where this information is then transmitted to a display 1504 for review by a user. Referring to FIG. 4, an example screen shot for the monitoring system is shown. The monitoring system is used for communication between the battery pack (or the BMU) and/or a maintenance side or user. As can be seen in FIG. 4, the cloud-based monitoring system displays information such as remote monitoring data, remote alarms and remote operation and maintenance to a user to monitor the system (or battery) and determines whether to run the active equilibrium battery management by analyzing the data to ensure the safe and efficient operation of the customer's energy storage system. The remote monitoring data may be generated by the remote monitoring module, the remote alarms may be generated by the remote alarms module and the remote operation and maintenance information may be generated by the remote operation and maintenance module. The monitoring system will frequently store the working data of the battery state based on a series of factors such as, but not limited to, the number of discharge cycles, depth of discharge, internal resistance, current, temperature, etc. according to different situations. By using data analysis techniques or artificial intelligence (AI) tools, it may be possible to optimize or improve an energy storage system beyond the state-of-the-art today.

In some embodiments, the apparatus for determining which equilibrium balancing approach to use could reside in the cloud-based monitoring system on a server whereby the determination may be performed by the local BMS, or in cloud-based monitoring system.

Figure 8:
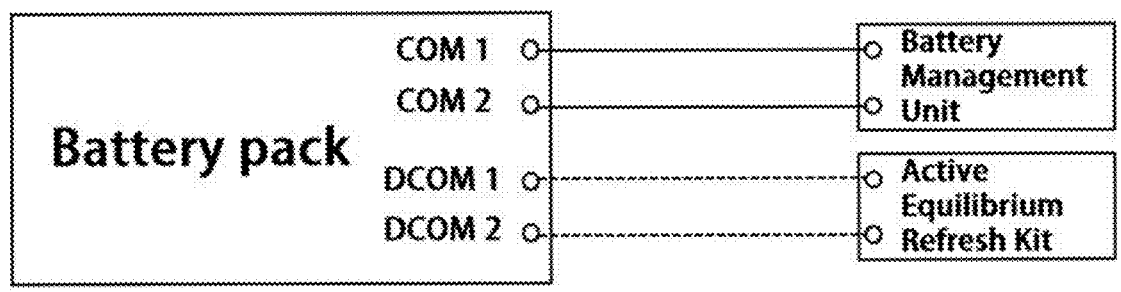
FIG. 8 is a schematic diagram of a dual-equilibrium battery system.
Figure 9:
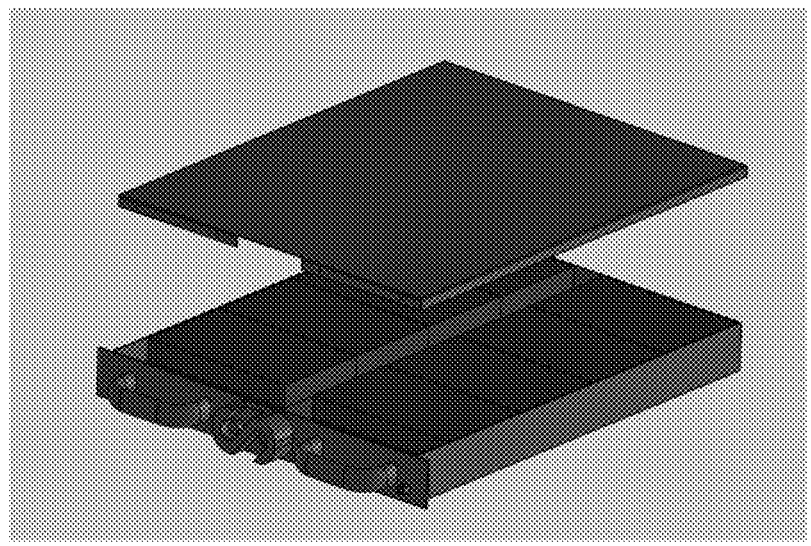
FIG. 9 is a perspective view of another layout of a battery pack.

FIG. 8 shows connections between a battery pack and the dual-equilibrium battery balancing system. In the figure, COM 1 and COM 2 is connected to the Battery Management System with the passive equilibrium balancing system. When active equilibrium balancing is required, the active equilibrium apparatus is connected to the DCOM 1 and DCOM 2 port to run the active equilibrium management process.

Similar to what showed in FIG. 8, FIG. 10 is another embodiment of a dual-equilibrium system connected to a battery pack.

One embodiment of a dual-equilibrium battery management method, or a method of battery cell management, is shown in FIG. 11. Initially, the BMS is running or executing a passive equilibrium battery management approach based on predetermined time periods, such as daily (1100). The passive equilibrium battery management system is preferably located and executes within the BMU. The BMS regularly monitors the SOC values of all the cells in real time and determines if the system requires an active equilibrium battery management approach according to the pre-set rules (1102). The pre-set rules will be explained in detail below. In some cases, the determination function could also be located in the cloud-based monitoring system. If the active equilibrium battery management approach is not required, the system keeps running with the passive equilibrium battery management approach (1100). If the active equilibrium battery management approach is required, the BMS or cloud-based monitoring system sends a maintenance request to the cloud-based monitoring system (1104a) or the local monitoring system (1104b), which can inform the maintenance staff to go to the equipment site and setup the active equilibrium battery balancing apparatus, such as an active equilibrium refresh kit (1106). Alternatively, the system may directly connect the battery cell to an active equilibrium battery management apparatus. In one embodiment, determination if the active equilibrium battery management approach should be used may be based on a kNN or AI judgment strategy as outlined below. Alternatively, the determination that the active equilibrium battery management approach is needed may also be based on predetermined settings. For example, the predetermined setting may request a change to active equilibrium battery management approach when a battery cell has gone through 1000 cycles of using or, in other words 1000 discharge and charge cycles.

After the active equilibrium balancing apparatus for operating the active equilibrium battery management approach is set up (such as by connecting the active equilibrium apparatus to DCOM1), battery cell management of the battery pack based on the active equilibrium battery approach is performed (1108). The BMS continues to check of the SOC of the cells to determine if the active equilibrium battery management approach still needs to be used (1110). When BMS determines that the system no longer needs the active equilibrium battery management approach, it sends another maintenance request to maintenance staff and the staff will uninstall the active equilibrium apparatus (1112) so that the system can return to running the passive equilibrium cell balancing process or battery management approach (1100).

Figure 12:
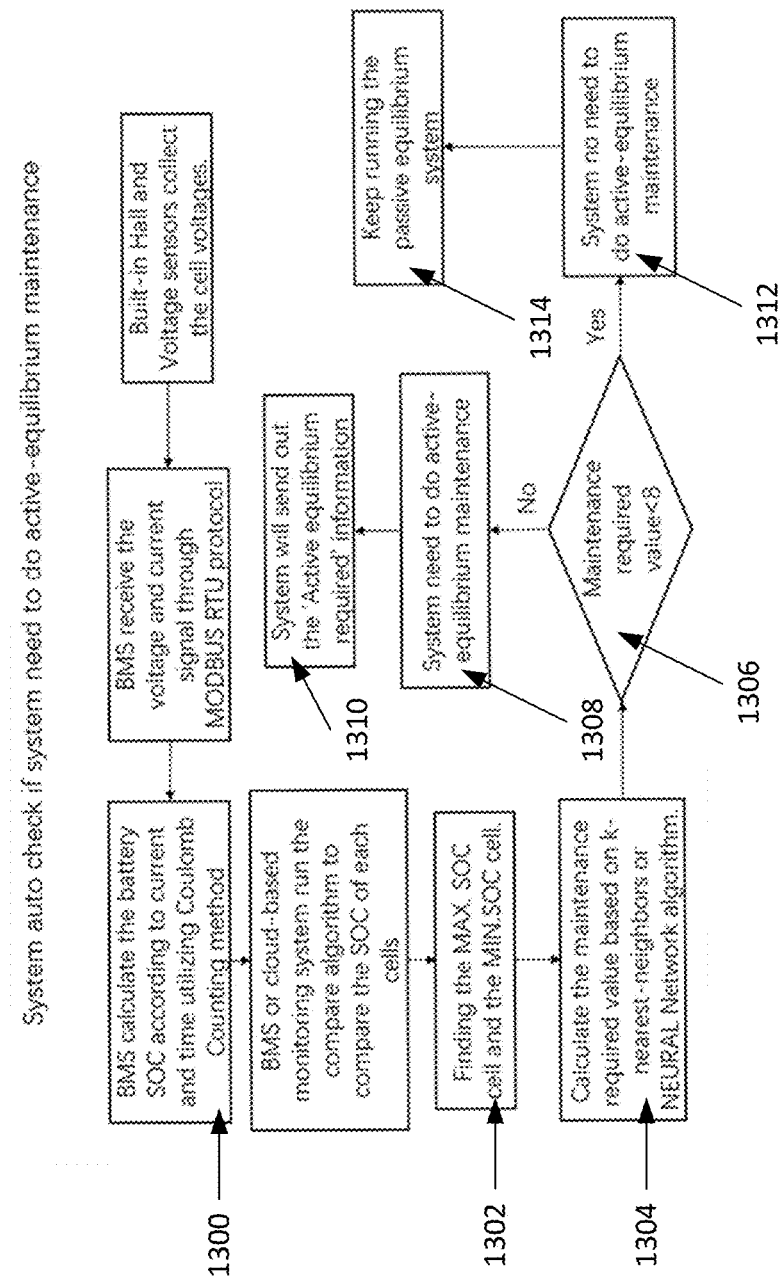
FIG. 12 is flowchart showing a method of active equilibrium maintenance auto-check of the dual-equilibrium battery management method using KNN algorithm.
Figure 13:
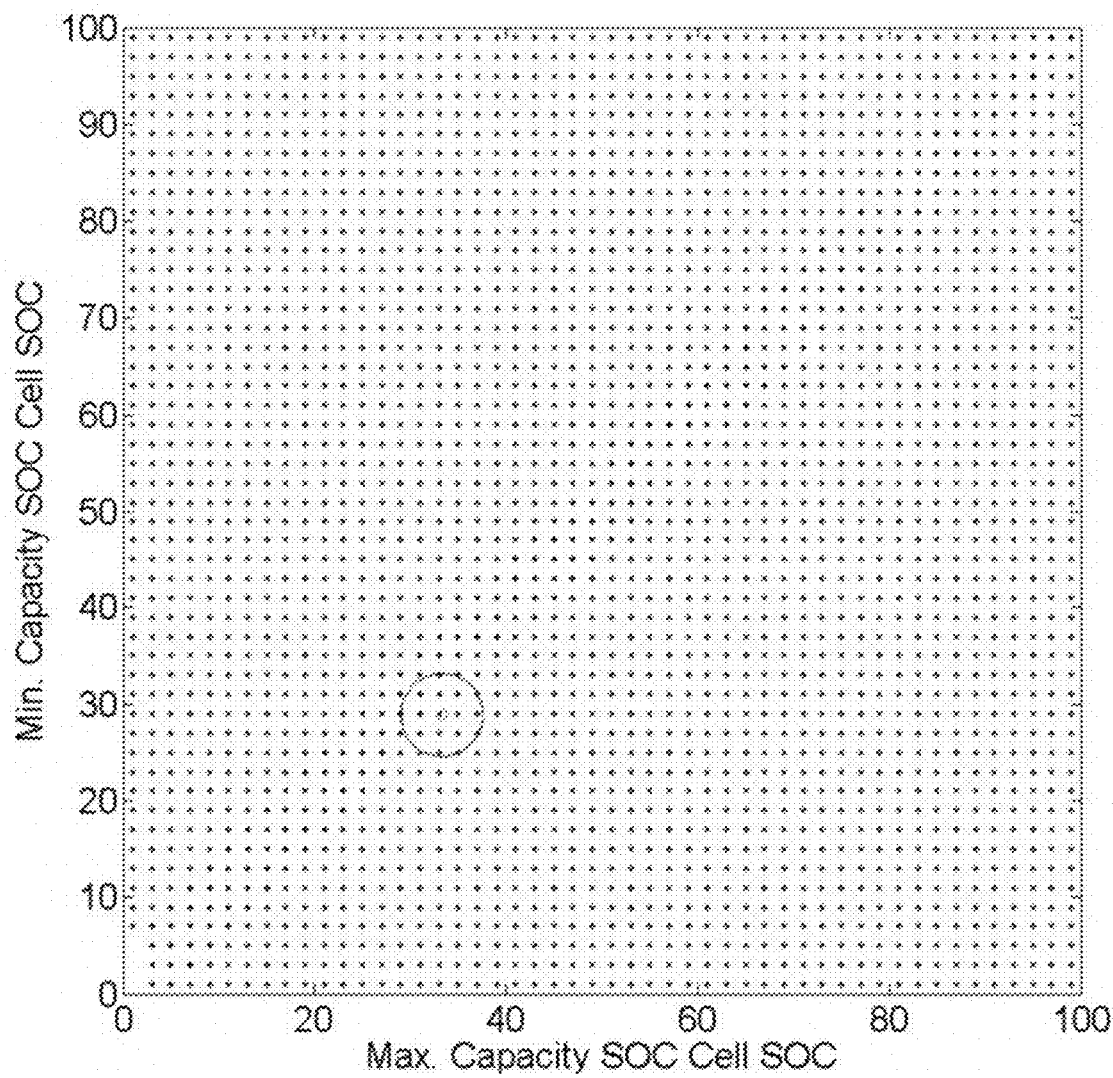
FIG. 13 is an example of the maximum and minimum SOC map.

Turning to FIG. 12, a flowchart outlining one embodiment of a method of determining if active equilibrium is required is shown. In other words, FIG. 12 is directed at the checking logic, or the 'pre-set rules' mentioned above of BMS to determine whether the system needs active equilibrium or not.

In the daily situation, the BMS keeps running the checking process to determine the SOC of each battery cell (1300) such as, for example, via a coulomb counting method, during which the BMS determines the cells with maximum or highest, and minimum, or lowest, SOC (1302). Coulomb counting relies on the integration of the current drawn from and supplied to a battery over time. The system then calculates the maintenance required value based on KNN (where K equals one less than the number of battery cells, or 15-NN in our example) model (1304). It should be understood that the checking process could also run in the cloud-based monitoring system in the monitoring side in some cases. The application of KNN in one embodiment is to define the K closest points around the real-time maximum (highest) and minimum (lowest) SOC status values, and then determine if the battery pack needs active equilibrium according to the character of the K points. Therefore, the KNN algorithm is also called 15-NN when a 16-cell battery pack is used. The definition of 'maintenance required value' mentioned in the flowchart (1304) may be represented in one embodiment as follows. If the maintenance required value is lower than one half of the number of battery cells, ((K+1)/2, or 8 in this example), the BMS will keep running the passive equilibrium battery management approach (1306). When the maintenance required value that is larger than (K+1)/2 is determined, battery cell management for the battery pack should be active equilibrium maintenance (1308). Once this is determined, a message may be transmitted for active equilibrium (1310) or the active equilibrium battery management approach may be initiated. If not, it is determined that active equilibrium is not needed (1312) the system remains in passive equilibrium mode (1314).

Figure 14:
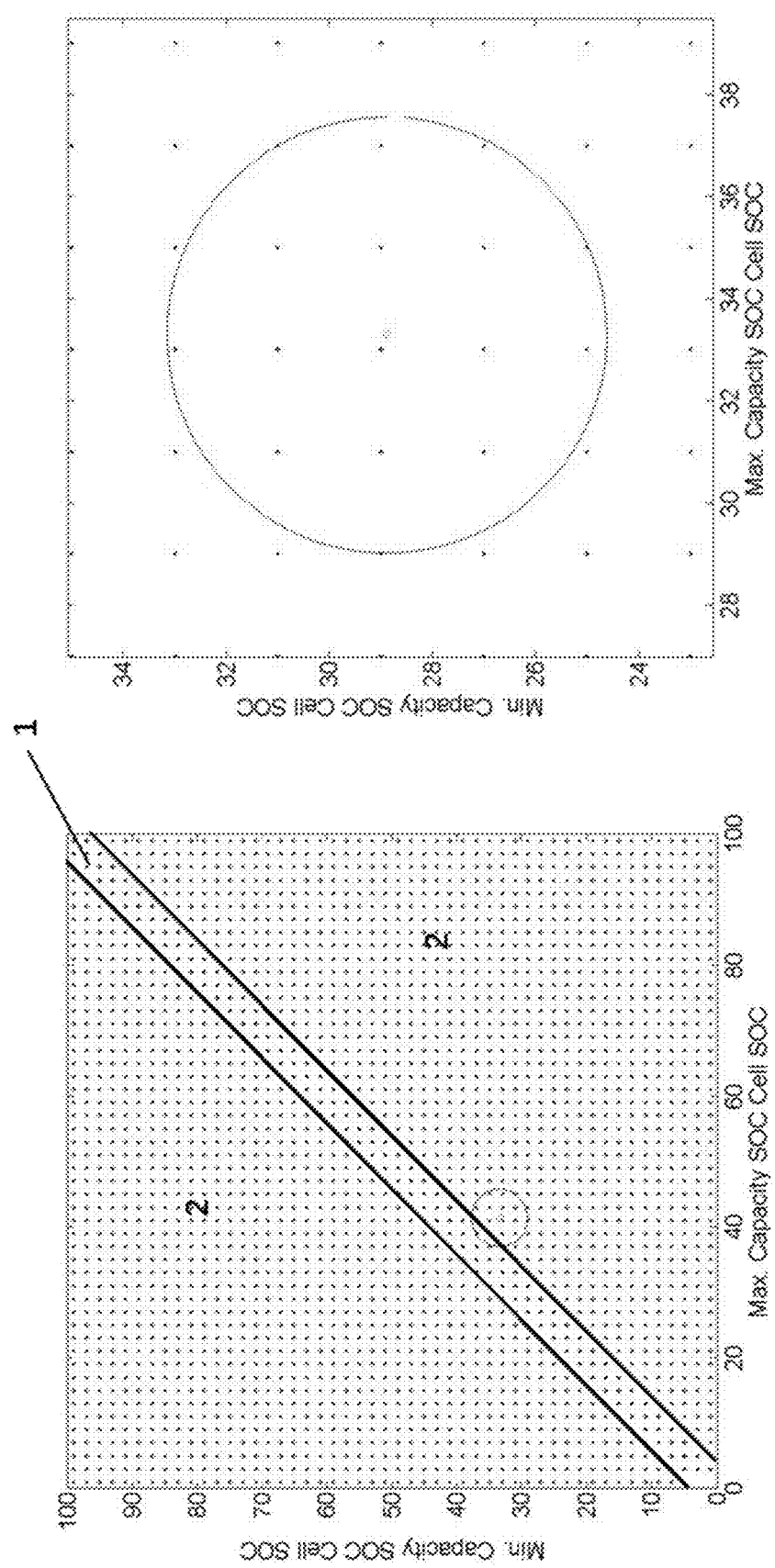
FIG. 14 and FIG. 15 are the examples of KNN diagrams calculating the maintenance value.

As outlined above, one aspect of the dual-equilibrium battery system and dual-equilibrium battery management method of the disclosure is to determine when to switch to the active equilibrium while the passive equilibrium is running. In one embodiment, this may be based on the SOC difference between cells with highest capacity and lowest capacity. In one embodiment, the system determines if its status indicates a need to switch to active equilibrium by checking the locations of the status in the Max.-Min. SOC map such as schematically shown in FIG. 14. In a preferred embodiment, some Artificial Intelligence (AI) based non-parametric algorithms such as K-Nearest Neighbors (KNN) is used to determine the status location. The implementation of dual-equilibrium method could also be extended to other AI algorithms such as ANN, and the like. In one embodiment, the BMS uses the KNN algorithm to determine when active equilibrium balancing is required.

The KNN algorithm is generally seen as a classification algorithm that is easy to grasp and effective. The KNN algorithm works as follows: example data is organized into a series of rows ("observations") with at least two columns ("predictor" or set of "predictors" and a "label"). On each row, for its given predictor(s), the label is set to a constant that describes the predictor (in the present instance as either "State of Charge okay" (represented as 1) or "State of Charge not okay" (represented as 0). When a new piece of battery data is received (such as SOC) to query, the KNN algorithm is applied to determine a label for the query data; that label can then be interpreted as to the State of Charge of the battery being either "okay" or "not okay". The KNN Algorithm works by calculating the distance from the query data to each of the example data points. It then sorts the distances into ascending order, and determines the query data label from the mode of the first K labels in the sorted distances.

The KNN algorithm chooses the minimum (lowest) and maximum (highest) SOC of the cells and defines the two kinds of states, active state or passive state according to the Min-Max SOC difference.

Figure 15:
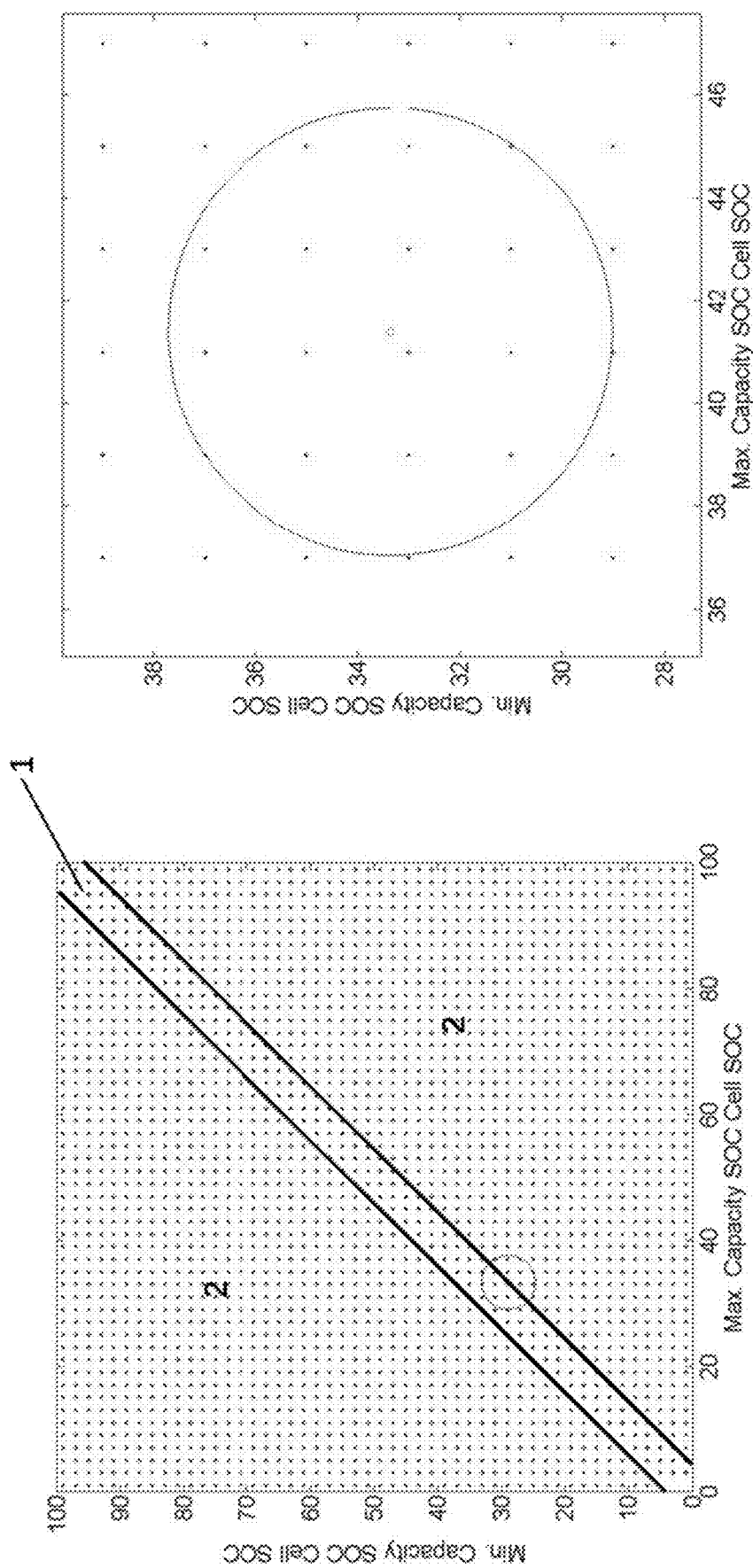

FIG. 15 indicates an example of max-min SOC map (upper chart) and a grid of initialization values (lower chart)

determined by complicated testing and calibration. In the lower chart, there are regions labelled '1' and '2' In application, the sizes of the regions '1' and '2' in the maximum and minimum SOC map are variable and will be determined during the initialization process. During initialization, the battery pack is actively balanced for each point in the maximum and minimum SOC map; the result is compared to the overall battery pack capacity improvement (FIG. 14). At each point, if the battery pack's overall improvement is greater than 5% through active balancing then it is determined that these points are indicators of the need for active balancing. These points are described in FIG. 14 as areas labelled '2'. Points that do not meet the criteria for '2' are labelled as '1'.

In regular operation (at a frequency of once per cycle) the system will check the SOC of each of the individual cells against the initialization grid of FIG. 15 (lower chart). For a given cell, the system will test its SOC value against K of its nearest neighbours. Graphically, the system defines the locations of the real-time status on the max-min SOC map according to the maximum and minimum SOC values, and then find out the K closest points of the real-time status point. The system then counts the number of points located in region 2 among the K points, defined as the maintenance required value. According to the definition of KNN algorithm, the K-nearest neighbor classifier can be viewed as assigning the K nearest neighbors a weight $$\frac{1}{k}$$

and all others a weight of zero. This can be generalized to weighted nearest neighbor classifiers. That is, where the ith nearest neighbor is assigned a weight $w_{ni}$ with $$\sum_{i=1}^{n} w_{in} = 1.$$

An analogous result on the strong consistency of weighted nearest neighbor classifiers also holds. In this embodiment, when the $$\sum_{i=1}^{n} w_{in} > 0.5$$

it is considered that $$\sum_{i=1}^{n} w_{in} = 1.$$

Therefore, the half number of k+1 is chosen (in this example k=15 so 8 is the cutoff value), as the judging criteria according to the definition and processing of the KNN algorithm. If maintenance required value is smaller than the cutoff value (8 in this example), the system can continue running with passive equilibrium and no active equilibrium is needed.

Figure 16:
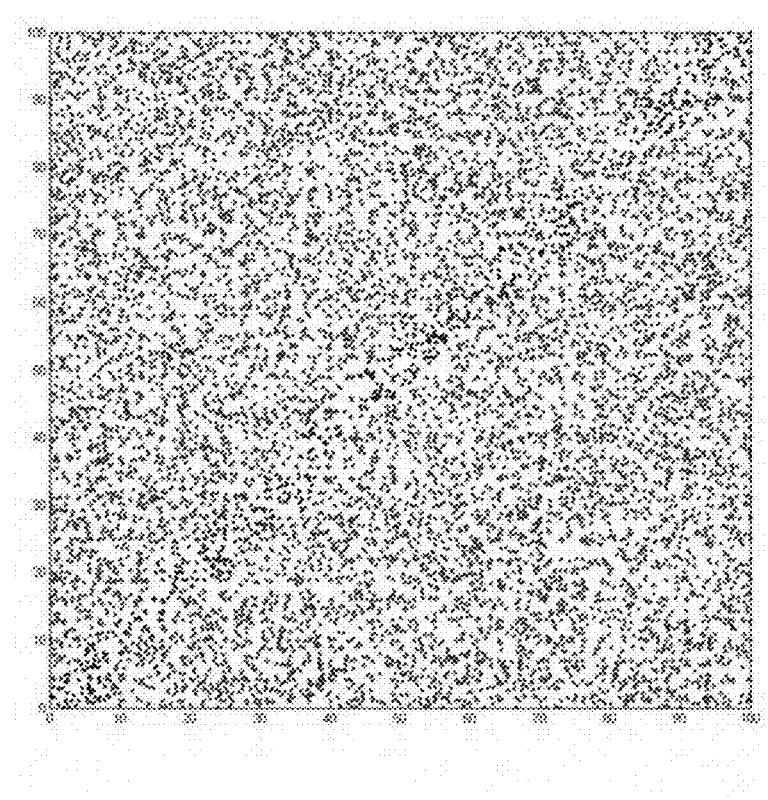
FIG. 16 is an example of the result of KNN learning and self-adjustment.
Figure 17:
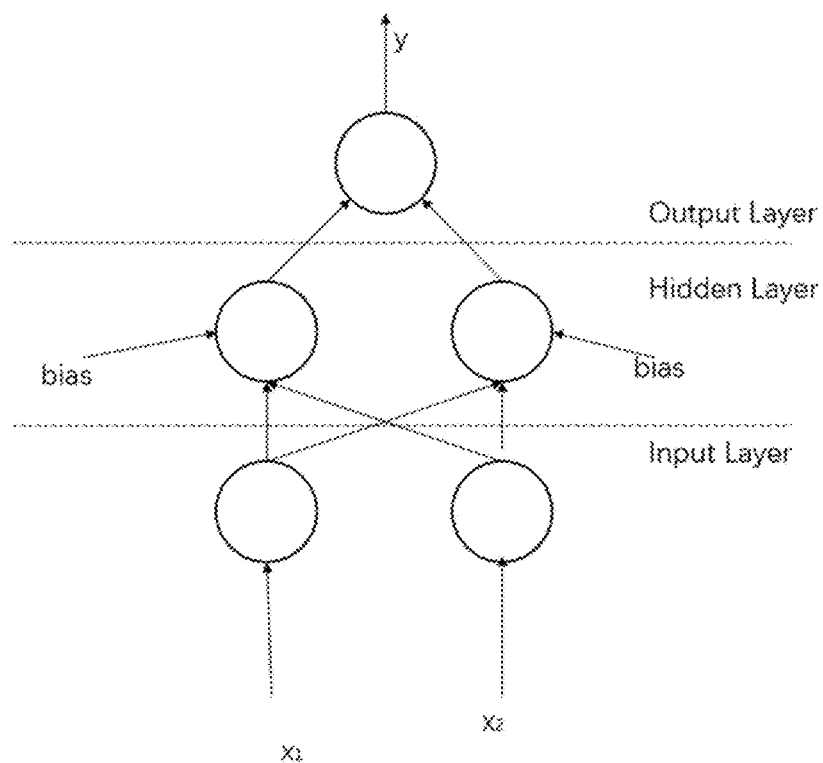
FIG. 17 is the structure of two-layer ANN (Artificial NEURAL Network) algorithm.

FIG. 16 shows the situation that more than 8 nearest neighbors are located in regions labelled '2'. In this situation the system has determined a need for active equilibrium and the maintenance requirement will be sent to monitoring system. The maintenance staff will then be sent to the site to do the active maintenance or the system may automatically switch to active equilibrium. FIG. 17 is the simulation result of the determination with given points.

Figure 18:
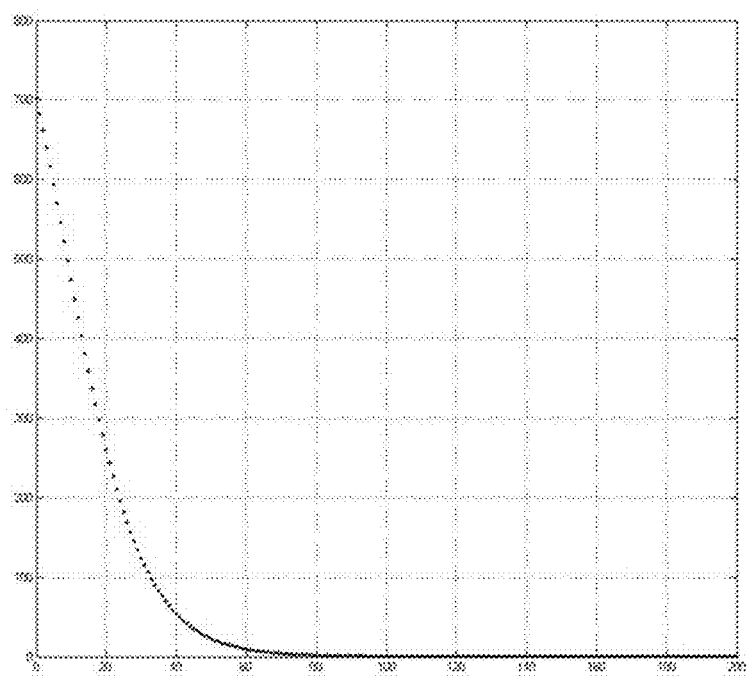
FIG. 18 is a chart showing the error during training processing.
Figure 19:
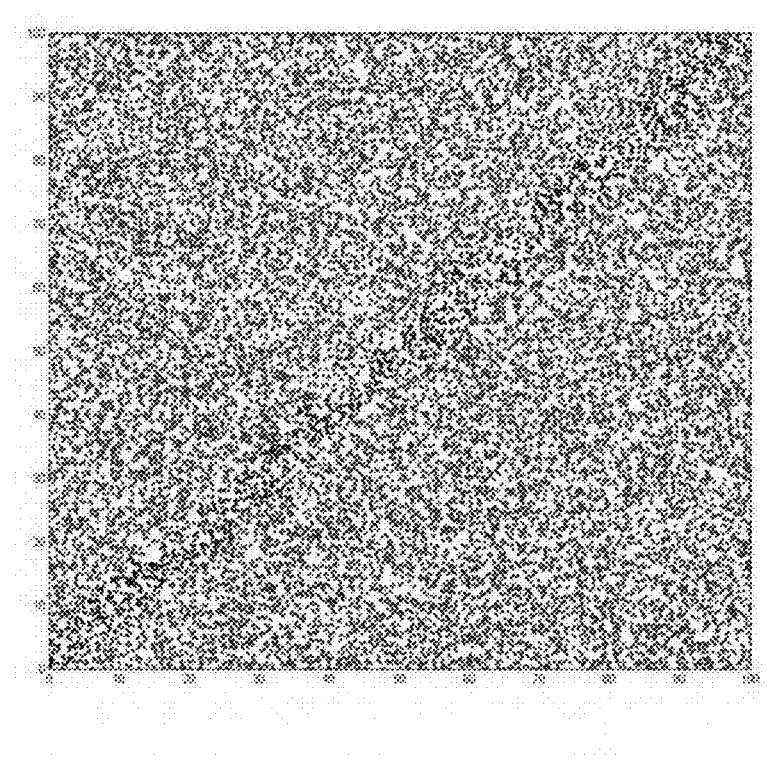
FIG. 19 is a map showing the training result of ANN.

Similar to KNN, an Artificial NEURAL Network (ANN) can be used to define the map, known as section 1 (passive state) and section 2 (active state), and check the Min-Max SOC value of a measurement to see whether the battery pack needs active equilibrium by checking the position of the measurement. FIG. 18 is the structure layout of the NEURAL Network used in this example. The ANN algorithm includes two layers, including "hide layer" for calculation, and output layer for calculating the output y to determine the characteristic of the Max-min SOC point. The NEURAL Network has two inputs, x1 and x2, which indicates maximum (highest) and minimum (lowest) SOC value of the battery pack. Firstly, 200 sets of x1 and x2 values with known characteristics are adopted to train the algorithm. The error during the training processing is shown in FIG. 18. As shown in the error curve, the error is decreasing as the training goes on. FIG. 19 shows the training results, which shows the points which need or do not need the active equilibrium maintenance procedure.

In this disclosure, this combination design and the KNN checking method is applied and will be tested based on a 16-cell battery pack. The system and method in this disclosure can be applied in other sizes battery pack with different capacities and cell numbers.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether the embodiments or elements thereof described herein are implemented as a software routine, hardware circuit, firmware, or a combination thereof.

Embodiments of the disclosure or elements thereof can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A method of dual equilibrium battery cell management for a battery having a set of battery cells comprising:

determining if an active equilibrium battery management approach should be used based on an output from an Artificial Intelligence (AI) based non-parametric algorithm, the output relating to a state of charge (SOC) capacity of each battery cell; and changing battery cell management from a passive equilibrium battery management approach to the active equilibrium battery management approach.

2. The method of claim 1 further comprising, before determining if the active battery management approach should be used:

using the passive equilibrium battery management approach for battery cell management.

3. The method of claim 1 wherein determining if the active equilibrium battery management approach should be used comprises:

determining the SOC capacity of each of the battery cells in the set of battery cells;

determining a highest capacity SOC from the SOC capacity of each of the battery cells in the set of battery cells;

determining a lowest capacity SOC from the SOC capacity of each of the battery cells in the set of battery cells; and comparing the highest capacity SOC and the lowest capacity SOC via the AI based non-parametric algorithm.

4. The method of claim 3 wherein the AI based non-parametric algorithm comprises a K-Nearest Neighbour (KNN) algorithm.

5. The method of claim 1 further comprising:

transmitting a signal requesting the active equilibrium battery management approach.

6. The method of claim 5 further comprising:

connecting an active equilibrium apparatus when the signal requesting the active equilibrium battery management approach is received.

7. The method of claim 1 further comprising:

connecting an active equilibrium apparatus when it is determined that the active equilibrium battery management approach is to be used.

8. The method of claim 1 wherein the AI based non-parametric algorithm is based on a K-Nearest Neighbor (KNN) algorithm.

9. An apparatus for dual equilibrium battery cell management for a battery having a set of battery cells comprising:

a passive equilibrium battery management apparatus continuously connected to the battery;

an active equilibrium battery management apparatus; and a processor for determining when the active equilibrium battery management apparatus is to be connected to the battery based on an output from an Artificial Intelligence (AI) based non-parametric algorithm, the output relating to a state of charge (SOC) capacity of each battery cell.

10. The apparatus of claim 9 wherein the passive equilibrium battery management apparatus is connected to the battery via a set of communication ports.

11. The apparatus of claim 9 wherein the active equilibrium battery management apparatus is connected to the battery via a set of communication ports.

12. The apparatus of claim 9 wherein the processor is connected to the battery to receive battery signals from the battery.

13. The apparatus of claim 9 wherein the active equilibrium battery management apparatus is an active equilibrium refresh kit.

14. The apparatus of claim 9 wherein the AI based non-parametric algorithm is based on a K-Nearest Neighbor (KNN) algorithm.

* * * * *